United States Patent
Ishibashi

(10) Patent No.: US 9,142,398 B2
(45) Date of Patent: Sep. 22, 2015

(54) SUBSTRATE PROCESSING METHOD

(71) Applicant: EBARA CORPORATION, Tokyo (JP)

(72) Inventor: Tomoatsu Ishibashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 14/191,365

(22) Filed: Feb. 26, 2014

(65) Prior Publication Data

US 2014/0248782 A1 Sep. 4, 2014

(30) Foreign Application Priority Data

Mar. 1, 2013 (JP) .................................. 2013-041149
Feb. 12, 2014 (JP) .................................. 2014-024551

(51) Int. Cl.

| B08B 3/00 | (2006.01) |
| H01L 21/02 | (2006.01) |
| H01L 21/67 | (2006.01) |
| B24B 37/10 | (2012.01) |
| B24B 37/34 | (2012.01) |
| B24B 49/12 | (2006.01) |
| B08B 3/02 | (2006.01) |
| B08B 3/04 | (2006.01) |
| B08B 7/00 | (2006.01) |

(52) U.S. Cl.
CPC .......... *H01L 21/02065* (2013.01); *B24B 37/10* (2013.01); *B24B 37/34* (2013.01); *B24B 49/12* (2013.01); *H01L 21/02074* (2013.01); *H01L 21/67028* (2013.01); *H01L 21/67034* (2013.01); *H01L 21/67046* (2013.01); *H01L 21/67051* (2013.01); *H01L 21/67115* (2013.01); *B08B 3/00* (2013.01); *B08B 3/02* (2013.01); *B08B 3/024* (2013.01); *B08B 3/04* (2013.01); *B08B 7/00* (2013.01); *B08B 7/005* (2013.01); *B08B 7/0035* (2013.01); *B08B 7/0057* (2013.01); *H01L 21/0206* (2013.01)

(58) Field of Classification Search
CPC .............. B08B 3/04; B08B 3/00; B08B 3/02; B08B 3/024; B08B 7/00; B08B 7/0035; B08B 7/005; B08B 7/0057; H01L 21/206; H01L 21/0206
USPC ........ 438/746; 134/1, 1.3, 26, 32, 33, 42, 902
See application file for complete search history.

(56) References Cited

U.S. PATENT DOCUMENTS

| 6,955,485 B2* | 10/2005 | Ono et al. ...................... 396/611 |
| 2005/0028928 A1* | 2/2005 | Asa ............................. 156/345.5 |
| 2007/0066066 A1* | 3/2007 | Kojima et al. ................ 438/691 |
| 2007/0103841 A1* | 5/2007 | Lee ............................... 361/212 |
| 2008/0004197 A1* | 1/2008 | Kneer ........................... 510/245 |

(Continued)

FOREIGN PATENT DOCUMENTS

| JP | 09-270412 | 10/1997 |
| JP | 10-189511 | 7/1998 |

(Continued)

*Primary Examiner* — Bibi Carrillo
(74) *Attorney, Agent, or Firm* — Baker & Hostetler LLP

(57) ABSTRACT

A substrate processing method includes rotating a substrate about a central axis thereof; starting irradiation of a surface of the substrate with soft X-rays; simultaneously with or after starting the irradiation of the surface of the substrate with the soft X-rays, starting supply of pure water onto the surface of the substrate; stopping the supply of the pure water onto the surface of the substrate; and then stopping the irradiation of the surface of the substrate with the soft X-rays.

10 Claims, 11 Drawing Sheets

(56) References Cited

U.S. PATENT DOCUMENTS

| | | | |
|---|---|---|---|
| 2008/0278880 A1* | 11/2008 | Kisakibaru et al. | 361/213 |
| 2009/0081810 A1* | 3/2009 | Hamada et al. | 438/5 |
| 2009/0084409 A1* | 4/2009 | Okura et al. | 134/21 |
| 2009/0137118 A1* | 5/2009 | Hirota et al. | 438/674 |
| 2010/0214712 A1* | 8/2010 | Yamawaku et al. | 361/213 |
| 2011/0115094 A1* | 5/2011 | Darnon et al. | 257/774 |
| 2012/0055506 A1* | 3/2012 | Moriya et al. | 134/1 |
| 2014/0045344 A1* | 2/2014 | Terao | 438/782 |

FOREIGN PATENT DOCUMENTS

| | | | |
|---|---|---|---|
| JP | 11214341 | * | 8/1999 |
| JP | 2003-188138 | | 7/2003 |
| WO | WO2010104207 | * | 9/2010 |

* cited by examiner

SUBSTRATE PROCESSING METHOD

CROSS REFERENCE TO RELATED APPLICATIONS

This document claims priorities to Japanese Patent Application No. 2013-41149 filed Mar. 1, 2013 and Japanese Patent Application No. 2014-24551 filed Feb. 12, 2014, the entire contents of which are hereby incorporated by reference.

BACKGROUND OF THE MENTION

1. Field of the Invention

The present invention relates to a method of processing (e.g., rinsing) a substrate with pure water or ultrapure water, and especially relates to a substrate processing method of processing a substrate while suppressing electrostatic charge of a structure (e.g., a dielectric film, a metallic film, or a device including a dielectric film and a metallic film) formed on the substrate.

2. Description of the Related Art

In a manufacturing process of a semiconductor device, various films having different physical properties are formed on a silicon substrate and these films are subjected to various processes, thus forming fine metal interconnects. For example, in a damascene interconnect forming process, interconnect trenches are formed in a film, and the interconnect trenches are then filled with metal. Thereafter, an unnecessary metal is removed by chemical mechanical polishing (CMP), so that metal interconnects are formed. A variety of films including a metal film, a barrier film, and a dielectric film exist on a surface of the substrate that has been manufactured through such a damascene interconnect forming process.

A CMP apparatus (polishing apparatus) for polishing a substrate typically includes a substrate cleaning apparatus for cleaning and drying a polished substrate. Cleaning of the substrate is performed by bringing a cleaning tool, such as a roll sponge, into sliding contact with the substrate while rotating the substrate. After cleaning of the substrate, ultrapure water (DIW) is supplied onto the rotating substrate, thereby rinsing the substrate. Before the substrate is dried, the ultrapure water is further supplied onto the rotating substrate to rinse the substrate.

It is commonly known that the ultrapure water, to be supplied onto the rotating substrate, has a high specific resistance value (≥15M Ω·cm) and that the surface of the substrate is electrostatically charged by the contact with the ultrapure water. Practically, experiments have confirmed that the surface of the substrate, on which metal interconnects and dielectric films are formed, is electrostatically charged as a result of the contact with the ultrapure water. Possible causes of such a phenomenon of the electrostatic charge may include the fact that the ultrapure water has a high specific resistance value and that the ultrapure water forms a flow on the rotating substrate, although the causes are uncertain. The electrostatic charge of the substrate surface may cause reattachment of particles that have been once removed by the cleaning process of the substrate surface, and may cause destruction of devices due to electrostatic discharge. Further, in devices having copper interconnects, copper (Cu) itself is liable to migrate under the influence of the surface charge, and may be attached to a dielectric film. Consequently, shortcut between the interconnects or leakage of current may occur, and/or poor adhesion between the copper interconnects and the dielectric film may occur.

Since the electrostatic charge of the substrate surface can lower a reliability of the devices, it is necessary to eliminate static electricity from the substrate. However, once a dielectric film, such as a TEOS film, is electrostatically charged, it is extremely difficult to remove the static electricity from the dielectric film. FIG. 1 is a graph showing results of an experiment for removing the static electricity from a TEOS film and PVC (polyvinyl chloride). In this experiment, ultrapure water was supplied onto a substrate having a TEOS Elm formed on a surface thereof, and onto a substrate having PVC formed on a surface thereof. The substrates were then irradiated with soft X-rays. A surface potential [V] of each substrate was measured before and after the soft X-ray irradiation. As can be seen from FIG. 1, the static electricity was removed from the PVC by the soft X-ray irradiation, while the static electricity was not removed from the TEOS film by the soft X-ray irradiation.

FIG. 2 is a graph showing results of an experiment for studying a change in a surface potential of a substrate with soft X-ray irradiation time. In this experiment, the ultrapure water was supplied onto a substrate having a TEOS film formed on a surface thereof, and the substrate was then irradiated with soft X-rays. A surface potential [V] of the TEOS film was measured after the substrate was irradiated with the soft X-rays for 30 seconds, 60 seconds, and 90 seconds. FIG. 2 also shows results of an experiment as a comparative example. In this comparative example, the ultrapure water was supplied onto the substrate, and then the surface potential [V] of the TEOS film of the substrate was measured without irradiating the substrate with the soft X-rays. As can be seen from FIG. 2, the surface potential of the TEOS film does not change regardless of the soft X-ray irradiation time. Moreover, the surface potential hardly differs between the case where the substrate was irradiated with the soft X-rays and the case where the substrate was not was irradiated with the soft X-rays. This means that the static electricity cannot be removed from the TEOS film by the soft X-ray irradiation.

SUMMARY OF THE INVENTION

The present invention has been made in view of the above circumstances. It is therefore an object of the present invention to provide a substrate processing method which can suppress electrostatic charge of a substrate having a structure (e.g., a dielectric film, a metallic film, or a device including a dielectric film and a metallic film) formed on a surface thereof.

In an embodiment, a substrate processing method includes: rotating a substrate about a central axis thereof; starting irradiation of a surface of the substrate with soft X-rays; simultaneously with or after starting the irradiation of the surface of the substrate with the soft X-rays, starting supply of pure water onto the surface of the substrate; stopping the supply of the pure water onto the surface of the substrate; and then stopping the irradiation of the surface of the substrate with the soft X-rays.

In an embodiment, the surface of the substrate is irradiated with the soft X-rays from a downstream side of an area, to which the pure water is supplied, with respect to a rotational direction of the substrate.

In an embodiment, stopping the irradiation comprises stopping the irradiation of the surface of the substrate with the soft X-rays after a liquid film sensor detects that a film of the pure water does not exist on the surface of the substrate.

In an embodiment, stopping the irradiation comprises stopping the irradiation of the surface of the substrate with the soft X-rays when a predetermined time has elapsed from a point of time when stopping the supply of the pure water onto the surface of the substrate.

In an embodiment, a structure including at least a dielectric film is formed on the surface of the substrate.

In an embodiment, the pure water comprises ultrapure water having a specific resistance value of not less than 15M Ω·cm.

In an embodiment, the substrate processing method further includes before starting the supply of the pure water onto the surface of the substrate, supplying a cleaning liquid onto the surface of the substrate to clean the substrate.

In an embodiment, a substrate processing method includes: rotating a substrate about a central axis thereof; supplying pure water onto a surface of the substrate while irradiating the surface of the substrate with soft X-rays; stopping the supplying of the pure water onto the surface of the substrate; and stopping the irradiating of the surface of the substrate with the soft X-rays.

As described above, once the dielectric film is electrostatically charged, it is almost impossible to eliminate the static electricity from the dielectric film. In view of this fact, the embodiment of this method suppresses the electrostatic charge of the substrate, instead of eliminating the static electricity that has been charged. Specifically, the surface of the substrate is irradiated with the soft X-rays while the pure water is being supplied onto the substrate. The irradiation of the substrate with the soft X-rays is started at the same time as or before the supply of pure water onto the substrate is started, and the irradiation of the substrate with the soft X-rays is stopped after the supply of the pure water onto the substrate is stopped. In other words, the substrate is irradiated with the soft X-rays at all times when the pure water forms a flow on the substrate. Therefore, it is possible to suppress the electrostatic charge of the substrate while supplying the pure water onto the substrate to process (e.g., rinse) the substrate.

DETAILED DESCRIPTION

Embodiments will be described below with reference to the drawings.

Figure 1:
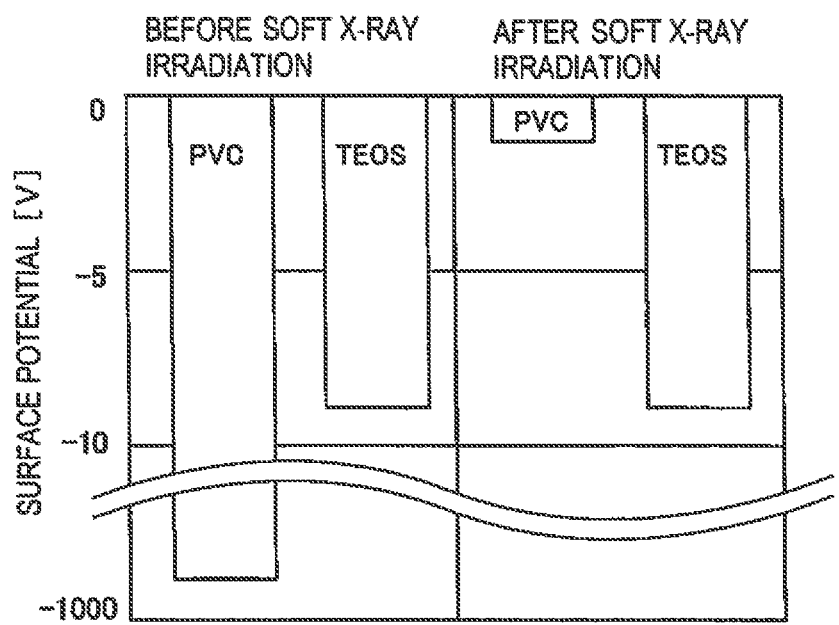
FIG. 1 is a graph showing results of an experiment for removing static electricity from a TEOS film and PVC (polyvinyl chloride)
Figure 2:
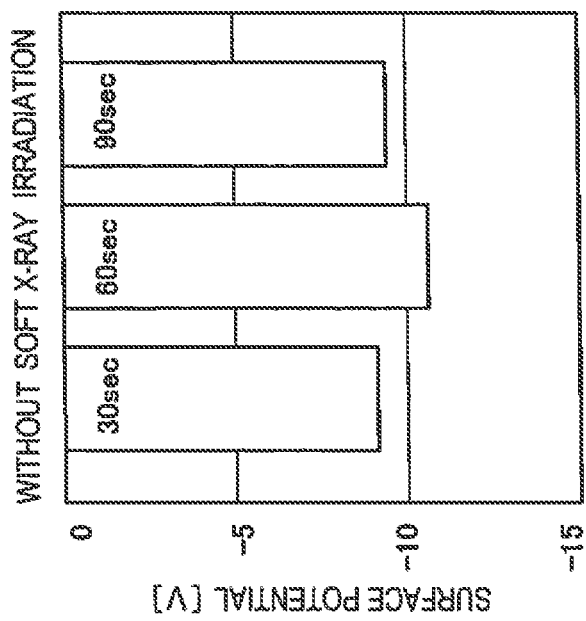
FIG. 2 is a graph showing results of an experiment for studying a change in a surface potential of a substrate with soft X-ray irradiation time.
Figure 2:
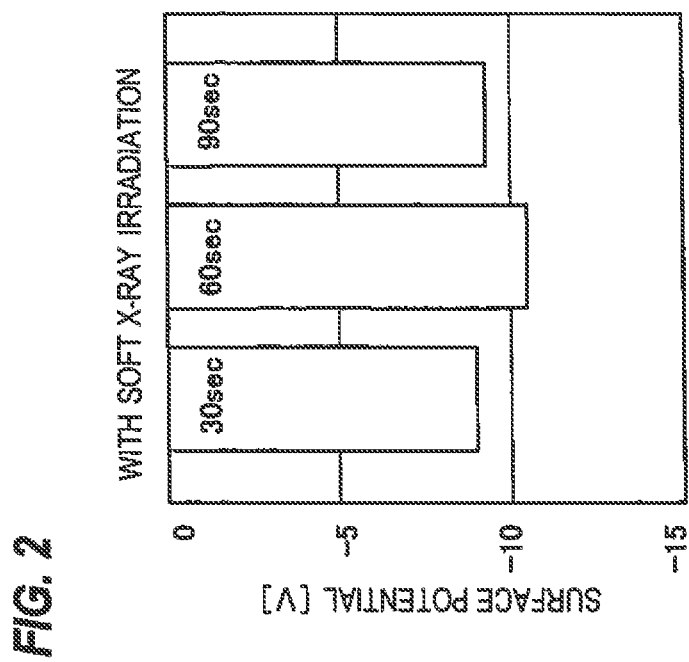
Figure 3:
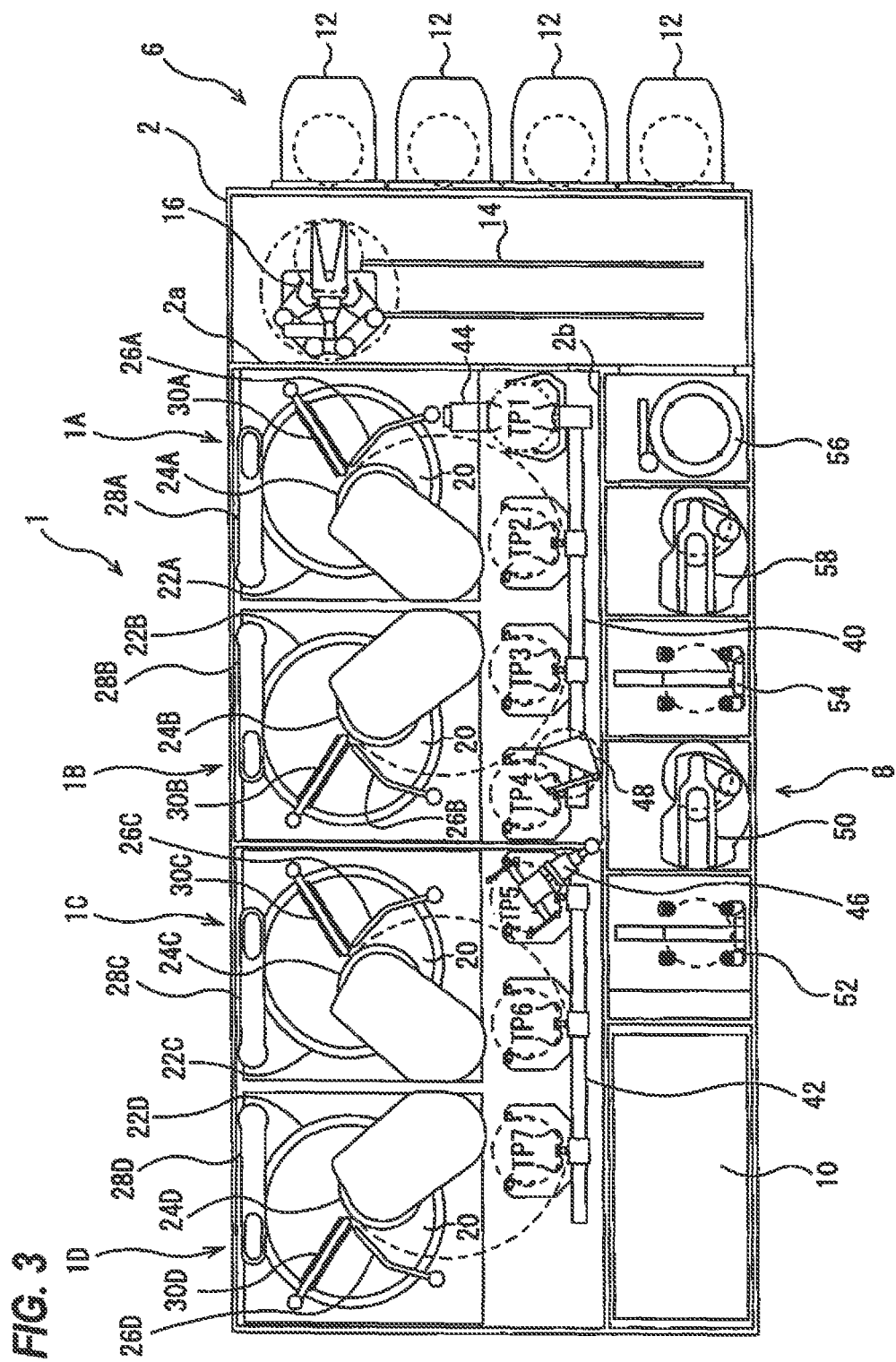
FIG. 3 is a view showing a polishing apparatus including a polishing unit, a cleaning unit, and a drying unit.

FIG. 3 is a view showing a polishing apparatus having a polishing omit, a cleaning unit, and a drying unit. This polishing apparatus is a substrate processing apparatus capable of performing a series of processes including polishing, cleaning, and drying of a wafer (or a substrate). As shown in FIG. 3, the polishing apparatus has a housing 2 in approximately a rectangular shape. An interior space of the housing 2 is divided by partitions 2a, 2b into a load-unload section 6, a polishing section 1, and a cleaning section 8. The polishing apparatus includes an operation controller 10 configured to control wafer processing operations.

The load-unload section 6 has load ports 12 on which wafer cassettes are placed, respectively. A plurality of wafers are stored in each wafer cassette. The load-unload section 6 has a moving mechanism 14 extending along an arrangement direction of the load ports 12. A transfer robot (loader) 16 is provided on the moving mechanism 14, so that the transfer robot 16 can move along the arrangement direction of the wafer cassettes. The transfer robot 16 moves on the moving mechanism 14 so as to access the wafer cassettes mounted to the load ports 12.

The polishing section 1 is an area where a wafer is polished. This polishing section 1 includes a first polishing unit 1A, a second polishing unit 1B, a third polishing unit 1C, and a fourth polishing unit 1D. The first polishing unit 1A includes a first polishing table 22A to which a polishing pad 20, having a polishing surface, is attached, a first top ring 24A for holding a wafer and pressing the wafer against the polishing pad 20 on the first polishing table 22A so as to polish the wafer, a first polishing liquid supply nozzle 26A for supplying a polishing liquid (e.g., slurry) and a dressing liquid (e.g., pure water) onto the polishing pad 20, a first dressing unit 28A for dressing the polishing surface of the polishing pad 20, and a first atomizer 30A for ejecting a mixture of a liquid (e.g., pure water) and a gas (e.g., nitrogen gas) or a liquid (e.g., pure water), in an atomized state, onto the polishing surface of the polishing pad 20.

Similarly, the second polishing unit 1B includes a second polishing table 22E to which a polishing pad 20 is attached, a second top ring 24B, a second polishing liquid supply nozzle 26B, a second dressing unit 28B, and a second atomizer 30B. The third polishing unit 1C includes a third polishing table 22C to which a polishing pad 20 is attached, a third top ring 24C, a third polishing liquid supply nozzle 26C, a third dressing unit 28C, and a third atomizer 30C. The fourth polishing unit ID includes a fourth polishing table 22D to which a polishing pad 20 is attached, a fourth top ring 24B, a fourth polishing liquid supply nozzle 26D, a fourth dressing unit 28D, and a fourth atomizer 30D).

A first linear transporter 40 is disposed adjacent to the first polishing unit 1A and the second polishing unit 1B. The first linear transporter 40 is a mechanism for transporting a wafer between four transfer positions (i.e., a first transfer position TP1, a second transfer position TP2, a third transfer position TP3 and a fourth transfer position TP4). A second linear transporter 42 is disposed adjacent to the third polishing unit IC and the fourth polishing unit 1D. The second linear transporter 42 is a mechanism for transporting a wafer between three transfer positions (i.e., a fifth transfer position TP5, a sixth transfer position TP6, and a seventh transfer position TP7).

A lifter 44 for receiving the wafer from the transfer robot 16 is disposed adjacent to the first transfer position TP1. The wafer is transported from the transfer robot 16 to the first linear transporter 40 via the lifter 44. A shutter (not shown in the drawing) is provided on the partition 2a. This shutter is located between the lifter 44 and the transfer robot 16. When the wafer is to be transported, the shutter is opened to allow the transfer robot 16 to transport the wafer to the lifter 44.

The wafer is transported to the lifter 44 by the transfer robot 16, then transported from the lifter 44 to the first linear transporter 40, and further transported to the polishing units 1A, 1B by the first linear transporter 40. The top ring 24A of the first polishing unit 1A is movable between a position above the first polishing table 22A and the second transfer position TP2 by a swing motion of the top ring 24A. Therefore, the wafer is transferred to and from the top ring 24A at the second transfer position TP2.

Similarly, the top ring 24B of the second polishing unit 1B is movable between a position above the polishing table 22B and the third transfer position TP3, and the wafer is transferred to and from the top ring 24B at the third transfer position TP3. The top ring 24C of the third polishing unit 1C is movable between a position above the polishing table 22C and the sixth transfer position TP6, and the wafer is transferred to and from the top ring 24C at the sixth transfer position TP6. The top ring 24D of the fourth polishing unit 1D is movable between a position above the polishing table 22D and the seventh transfer position TP7, and the wafer is transferred to and from the top ring 24D at the seventh transfer position TP7.

A swing transporter 46 is provided between the first linear transporter 40, the second linear transporter 42, and the cleaning section 8. Transporting of the wafer from the first linear transporter 40 to the second linear transporter 42 is performed by the swing transporter 46. The wafer is transported to the third polishing unit 1C and/or the fourth polishing unit 1D by the second linear transporter 42.

A temporary stage 48 for the wafer W is disposed beside the swing transporter 46. This temporary stage 48 is mounted to a non-illustrated frame. As shown in FIG. 3, the temporary stage 48 is disposed adjacent to the first linear transporter 40 and located between the first linear transporter 40 and the cleaning section 8. The swing transporter 46 is configured to transport the wafer between the fourth transfer position TP4, the fifth transfer position TP5, and the temporary stage 48.

The wafer, once placed on the temporary stage 48, is transported to the cleaning section 8 by a first transfer robot 50 of the cleaning section 8. The cleaning section 8 includes a first cleaning unit 52 and a second cleaning unit 54 each for cleaning the polished wafer with a cleaning liquid, and a drying unit 56 for drying the cleaned wafer. The first transfer robot 50 is operable to transport the wafer from the temporary stage 48 to the first cleaning unit 52 and further transport the wafer from the first cleaning unit 52 to the second cleaning unit 54. A second transfer robot 58 is disposed between the second cleaning unit 54 and the drying unit 56. This second transfer robot 58 is operable to transport the wafer from the second cleaning unit 54 to the drying unit 56.

The dried wafer is removed from the drying unit 56 and returned to the wafer cassette by the transfer robot 16. In this manner, a series of processes including polishing, cleaning, and drying of the wafer is performed.

Figure 4:
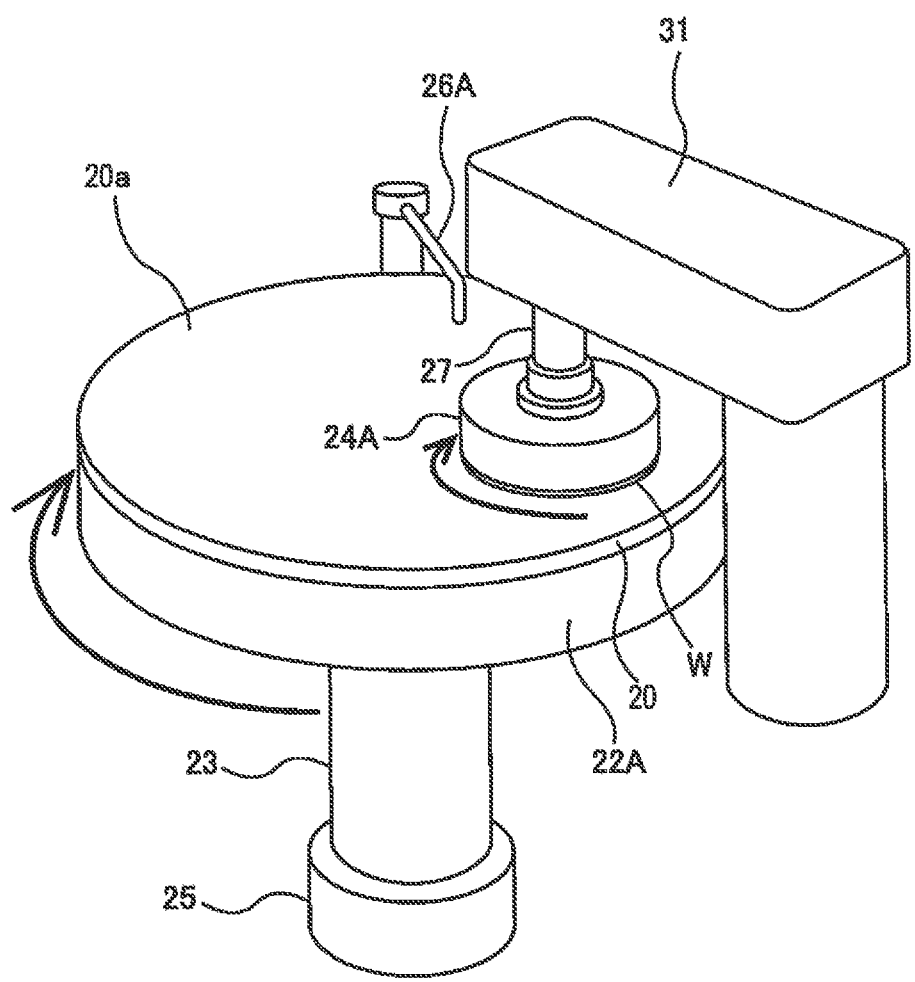
FIG. 4 is a schematic perspective view showing the polishing unit.

The first polishing unit 1A, the second polishing wilt 1B, the third polishing unit 1C, and the fourth polishing unit. 1D have the same structure as each other. Therefore, the first polishing unit 1A will be described below. FIG. 4 is a schematic perspective view showing the first polishing unit 1A. As shown in FIG. 4, the first polishing unit 1A includes the polishing table 22A supporting the polishing pad 20, the top ring 24A for pressing the wafer W against the polishing pad 20, and the polishing liquid supply nozzle 26A for supplying the polishing liquid (or slurry) onto the polishing pad 20. In FIG. 4, illustration of the first dressing unit 28A and the first atomizer 30A is omitted.

The polishing table 22A is coupled via a table shaft 23 to a table motor 25 disposed below the polishing table 22A, so that the polishing table 22A is rotated by the table motor 25 in a direction indicated by arrow. The polishing pad 20 is attached to an upper surface of the polishing table 22A. The polishing pad 20 has an upper surface, which provides a polishing surface 20a for polishing the wafer W. The top ring 24A is secured to a lower end of a top ring shaft 27. The top ring 24A is configured to be able to hold the wafer W on its lower surface by vacuum suction. The top ring shaft 27 is coupled to a rotating device (not shown) disposed in a top ring arm 31, so that the top ring 24A is rotated by the rotating device through the top ring shaft 27.

Polishing of the surface of the wafer W is performed as follows. The top ring 24A and the polishing table 22A are rotated in respective directions indicated by arrows, and the polishing liquid (e.g., the slurry) is supplied from the polishing liquid supply nozzle 26A onto the polishing pad 20. In this state, the wafer W is pressed against the polishing surface 20a of the polishing pad 20 by the top ring 24A. The surface of the wafer W is polished by a mechanical action of abrasive grains contained in the polishing liquid and a chemical action of a chemical component contained in the polishing liquid.

Figure 5:
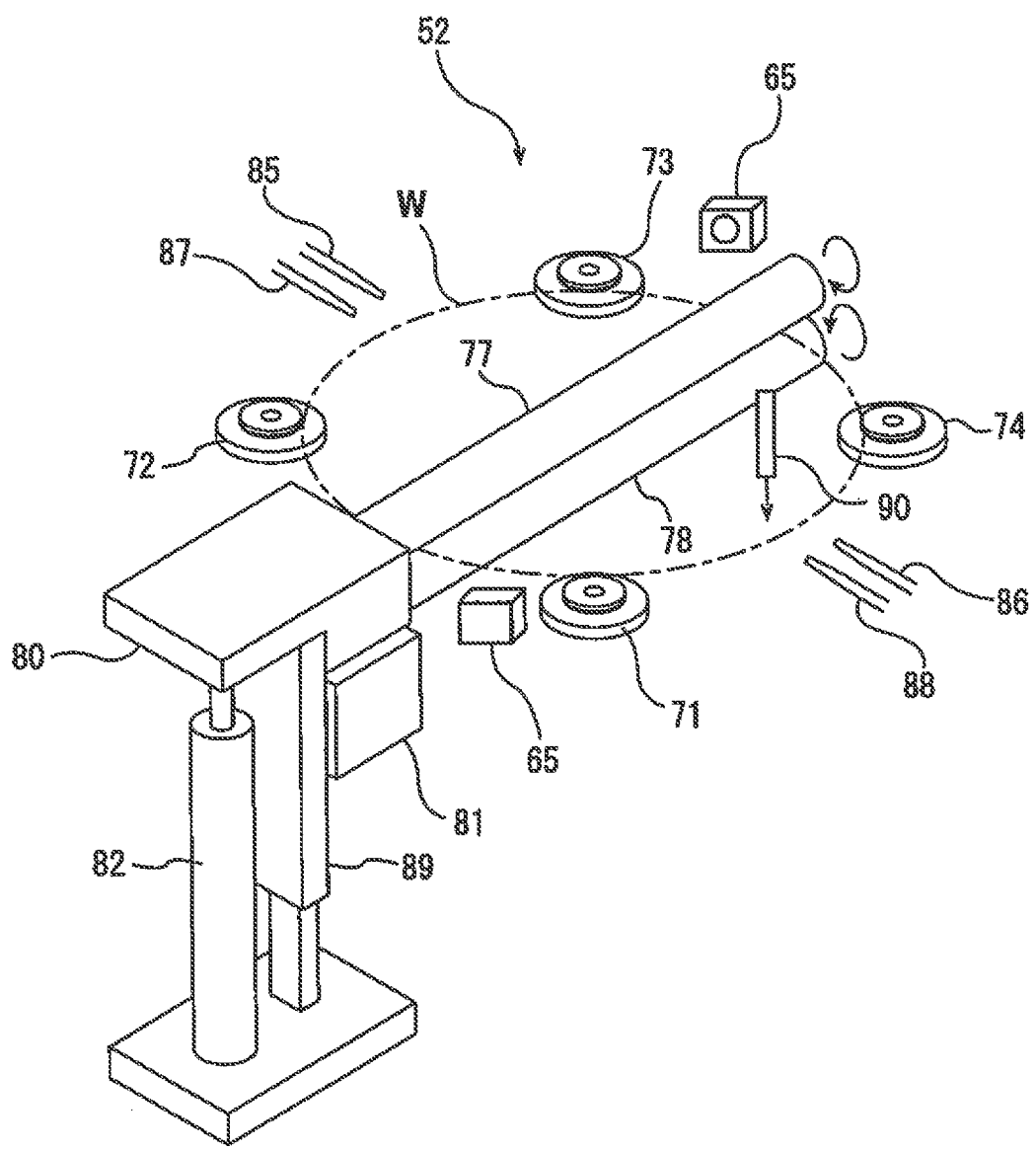
FIG. 5 is a schematic perspective view showing a cleaning unit (or a substrate cleaning apparatus) of roll sponge type.

The first cleaning unit 52 and the second cleaning unit 54 have the same structure as each other. Therefore, the first cleaning unit 52 will be described below. FIG. 5 is a schematic perspective view showing the first cleaning unit (substrate cleaning apparatus) 52. As shown in FIG. 5, the first cleaning unit 52 includes four holding rollers 71, 72, 73, 74 for holding and rotating the wafer W horizontally, roll sponges (cleaning tools) 77, 78 configured to contact upper and lower surfaces of the wafer W, respectively, rotating devices 80, 81 for rotating the roll sponges 77, 78, upper pure water supply nozzles 85, 86 for supplying pure water (preferably, ultrapure water) onto the upper surface (the surface on which a dielectric film, a metallic film, or a structure, such as a device, including a dielectric film and a metallic film is formed) of the wafer W, and upper cleaning liquid supply nozzles 87, 88 for supplying a cleaning liquid (chemical liquid) onto the upper surface of the wafer W. Although not shown in FIG. 5, lower pure water supply nozzles for supplying pure water (preferably, ultrapure water) onto the lower surface of the wafer W, and lower cleaning liquid supply nozzles for supplying a cleaning liquid (chemical liquid) onto the lower surface of the wafer W are provided.

The holding rollers 71, 72, 73, 74 are configured to be movable in directions closer to and away from the wafer W by a non-illustrated moving mechanism (e.g., an air cylinder). The rotating device 80, which is configured to rotate the upper roll sponge 77, is mounted to a guide rail 89 that guides a vertical movement of the rotating device 80. The rotating device 80 is supported by an elevating device 82 so that the rotating device 80 and the upper roll sponge 77 are moved in the vertical direction by the elevating device 82. Although not shown in FIG. 5, the rotating device 81, which is configured to rotate the lower roll sponge 78, is also mounted to a guide rail. The rotating device 81 and the lower roll sponge 78 are moved vertically by an elevating device (not shown). A motor-drive mechanism employing a ball screw, an air cylinder, or the like is used as the elevating device. When the wafer W is to be cleaned, the roll sponges 77, 78 are moved closer to each other until the roll sponges 77, 78 contact the upper and lower surfaces of the wafer W, respectively.

Figure 6:
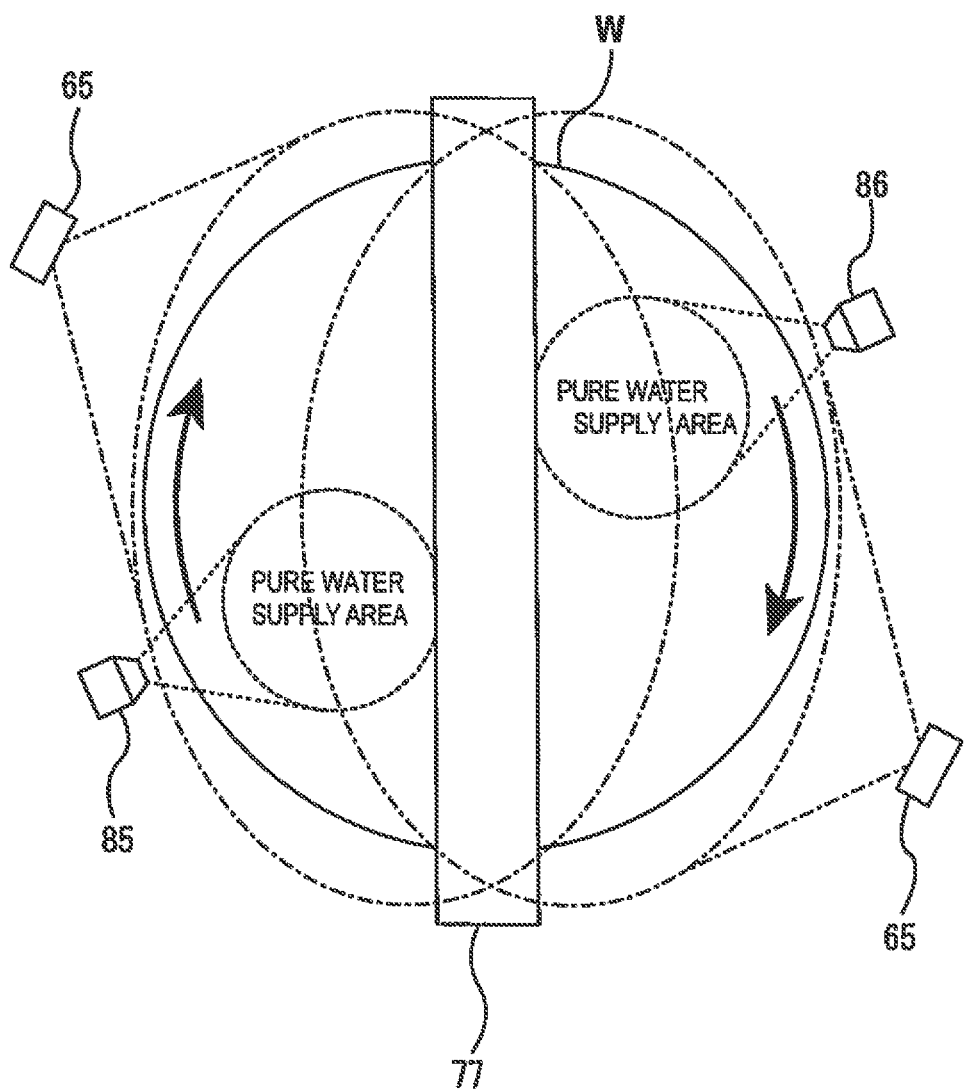
FIG. 6 is a plan view of the cleaning unit of roll sponge type.

FIG. 6 is a plan view of the cleaning unit. As shown in FIG. 6, two soft X-ray irradiators 65, 65 are disposed adjacent to the wafer W held by the holding rollers 71, 72, 73, 74. The soft X-ray irradiators 65, 65 are arranged symmetrically with respect to the center of the wafer W, and face toward the upper surface of the wafer W. The soft X-ray irradiators 65, 65 are disposed at downstream sides of the pure water supply nozzles 85, 86, respectively, with respect to a rotational direction (indicated by arrow) of the wafer W. Accordingly, the soft X-ray irradiators 65, 65 irradiate the upper surface of the wafer W with soft X-rays from downstream sides of areas on the wafer W where the pure water is supplied. With such an arrangement, the pure water that has been supplied onto the wafer W can be immediately irradiated with the soft X-rays, which can suppress electrostatic charge of the wafer W reliably.

As shown in FIG. 6, the roll sponge 77 is disposed across the wafer W. Thus, in order not to allow the roll sponge 77 to block the soft X-rays, the two soft X-ray irradiators 65, 65 are arranged at both sides of the roll sponge 77 such that the roll sponge 77 is interposed between the two soft X-ray irradiators 65, 65. Therefore, the upper surface of the wafer W in its entirety is irradiated with the soft X-rays emitted from the two soft X-ray irradiators 65, 65.

Next, a process of cleaning the wafer W will be described. First, the wafer W is rotated about its own axis. Then the cleaning liquid is supplied onto the upper surface of the wafer W from the upper cleaning liquid supply nozzles 87, 88, and the cleaning liquid is supplied onto the lower surface of the wafer W from the lower cleaning liquid supply nozzles (not shown). In this state, the roll sponges 77, 78 are brought into sliding contact with the upper and lower surfaces of the wafer W, respectively, while the roll sponges 77, 78 are rotating about their own axes extending horizontally, to thereby scrub the upper and lower surfaces of the wafer W.

After scrubbing of the wafer W, the pure water is supplied onto the rotating wafer W to thereby rinse the wafer W. The rinsing of the wafer W may be performed while keeping the roll sponges 77, 78 in sliding contact with the upper and lower surfaces of the wafer W, or may be performed while keeping the roll sponges 77, 78 away from the upper and lower surfaces of the wafer W.

Figure 7:
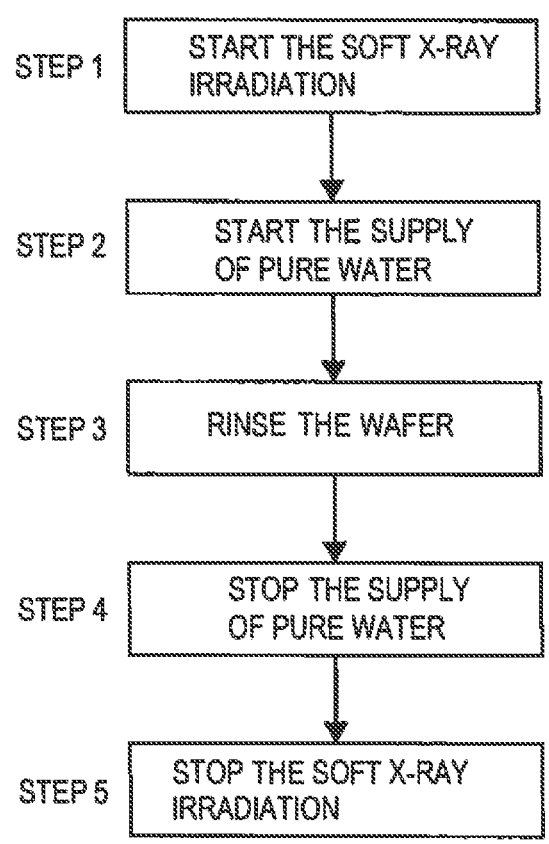
FIG. 7 is a flowchart showing a process of rinsing a wafer.

The rinsing of the wafer W will be described below with reference to a flowchart of FIG. 7. First, the irradiation of the rotating wafer W with the soft. X-rays is started (step 1). Subsequently, in order to rinse off the cleaning liquid from the wafer W, the supply of the pure water from the upper pure water supply nozzles 85, 86 onto the upper surface of the wafer W and the supply of the pure water from the lower pure water supply nozzles (not shown) onto the lower surface of the wafer W are started (step 2), and the wafer W is thus rinsed with the pure water (step 3). Next, the supply of the pure water to the wafer W is stopped (step 4). Thereafter, the irradiation of the wafer W with the soft X-rays is stopped (step 5).

In this manner, the soft X-ray irradiation of the wafer W is started before the supply of the pure water (or ultrapure water) onto the wafer W is started, and the soft X-ray irradiation of the wafer W is stopped after the supply of the pure water (or ultrapure water) onto the wafer W is stopped. In other words, the wafer W is irradiated with the soft X-rays at all times when the pure water is being supplied onto the wafer W.

The supply of the pure water onto the wafer W may be started at the same time as the irradiation of the wafer W with the soft X-rays is started. More specifically, the step 1 and the step 2 of the flowchart shown in FIG. 7 may be performed simultaneously. In this case also, the wafer W is irradiated with the soft X-rays at all dines when the pure water is being supplied onto the wafer W. Therefore, the electrostatic charge of the wafer W can be prevented.

The pure water may remain on the wafer W for a while after the supply of the pure water onto the wafer W is stopped. Thus, the soft X-ray irradiation may be stopped when a predetermined time has elapsed from a point of time when the supply of the pure water onto the wafer W is stopped. Further, the soft X-ray irradiation may be stopped when or after it is detected that a film of the pure water does not exist on the wafer W. For example, the irradiation of the wafer W with the soft X-rays may be stopped after a liquid film sensor 90, which is provided for detecting a liquid film on the wafer W as shown in FIG. 5, detects that a remaining liquid film does not exist on the wafer W. Such liquid film sensor 90 may be an optical displacement meter.

Figure 8:
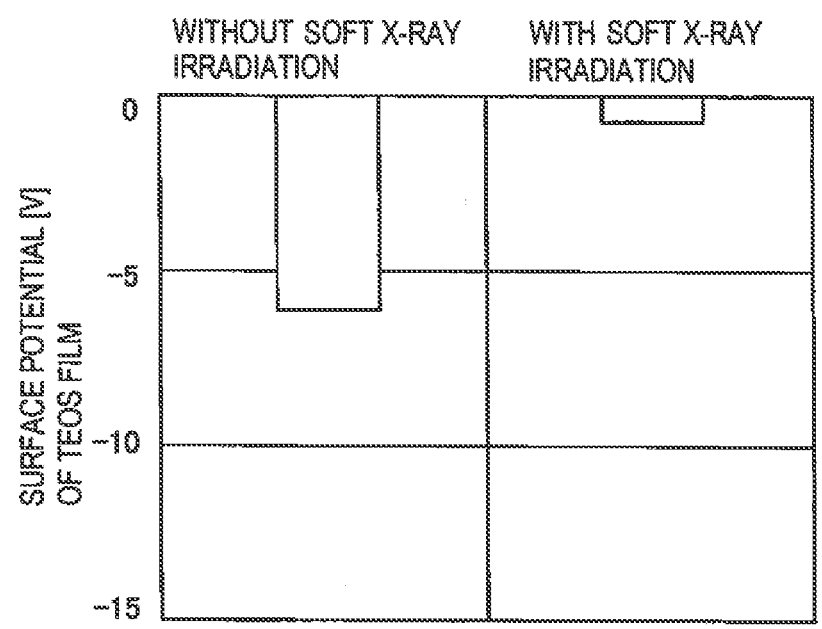
FIG. 8 is a graph showing results of an experiment for studying the fact that the soft X-ray irradiation suppresses electrostatic charge of the wafer.

It is known that a wafer is electrostatically charged when pure water, especially ultrapure water having a high specific resistance value ($\geq 15M$ $\Omega \cdot cm$), is supplied onto the wafer. The inventor of the present invention has conducted various experiments and verified that the electrostatic charge of a wafer can be suppressed if the ultrapure water is supplied onto the wafer while the wafer is irradiated with the soft X-rays. FIG. 8 is a graph showing results of the experiment for studying that the soft X-ray irradiation suppresses the electrostatic charge of the wafer. This experiment was conducted with the use of the cleaning unit shown in FIG. 5. In this experiment, after the ultrapure water was supplied onto the wafer, a surface potential of a TEOS film (i.e., an interlayer dielectric film) on the wafer was measured. It can be seen from the experimental results shown in FIG. 8 that the surface potential of the wafer can be suppressed to be low if the wafer is irradiated with the soft X-rays when the ultrapure water is supplied onto the wafer, as compared to a case where the wafer is not irradiated with the soft X-rays. Therefore, this embodiment of the substrate processing method can prevent defects of the wafer (substrate) that could be caused by the electrostatic charge of the wafer.

Figure 9:
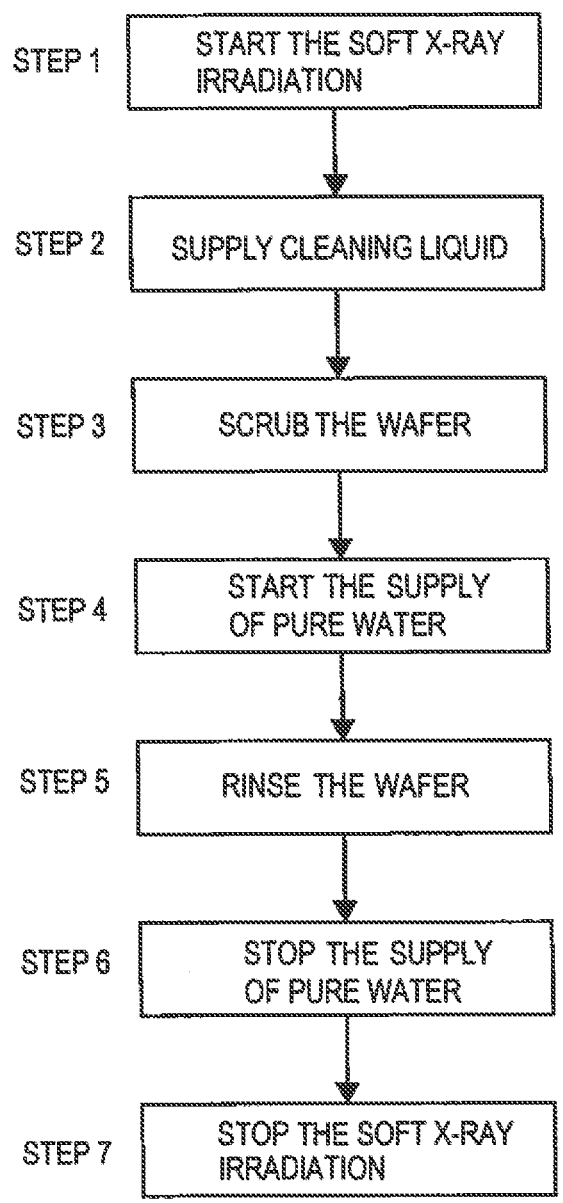
FIG. 9 is a flowchart showing an example in which the wafer is irradiated with soft X-rays during scrubbing and rinsing of the wafer.

The cleaning liquid for use in scrubbing of the wafer generally has a lower specific resistance value than that of the pure water. However, some types of cleaning liquid may contain much pure water therein. Use of such a cleaning liquid is liable to cause the electrostatic charge of the wafer W. In such a case, the wafer W may be irradiated with the soft X-rays during scrubbing of the wafer W. FIG. 9 is a flowchart showing an example in which the wafer is irradiated with the soft X-rays during scrubbing and rinsing of the wafer W. As shown in FIG. 9, first, when the wafer W is being rotated, the irradiation of the wafer W with the soft X-rays is started (step 1). Subsequently, the supply of the cleaning liquid from the upper cleaning liquid supply nozzles 87, 88 onto the upper surface of the wafer W and the supply of the cleaning liquid from the lower cleaning liquid supply nozzles (not shown) onto the lower surface of the wafer W are started (step 2). In this state, the roll sponges 77, 78 are brought into sliding contact with the upper and lower surfaces of the wafer W, respectively, while the roll sponges 77, 78 are rotating about their own axes extending horizontally, to thereby scrub the upper and lower surfaces of the wafer W (step 3).

After scrubbing, the supply of the cleaning liquid is stopped. In order to rinse off the cleaning liquid from the wafer W, the supply of the pure water from the upper pure water supply nozzles 85, 86 onto the upper surface of the wafer W and the supply of the pure water from the lower pure water supply nozzles (not shown) onto the lower surface of the wafer W are started (step 4), and the wafer W is thus rinsed with the pure water (step 5). Next, the supply of the pure water onto the wafer W is stopped (step 6), and thereafter the irradiation of the wafer W with the soft X-rays is stopped (step 7). The substrate cleaning method shown in FIG. 9 can suppress the electrostatic charge of the wafer W during scrubbing and rinsing of the wafer W.

The supply of the cleaning liquid onto the wafer W may be started at the same time as the irradiation of the wafer W with the soft X-rays is started. More specifically, the step 1 and the step 2 of the flowchart shown in FIG. 9 may be performed simultaneously. In this case also, the wafer W is irradiated with the soft X-rays at all times when the pure water and the cleaning liquid are being supplied onto the wafer W. Therefore, the electrostatic charge of the wafer W can be prevented.

Figure 10:
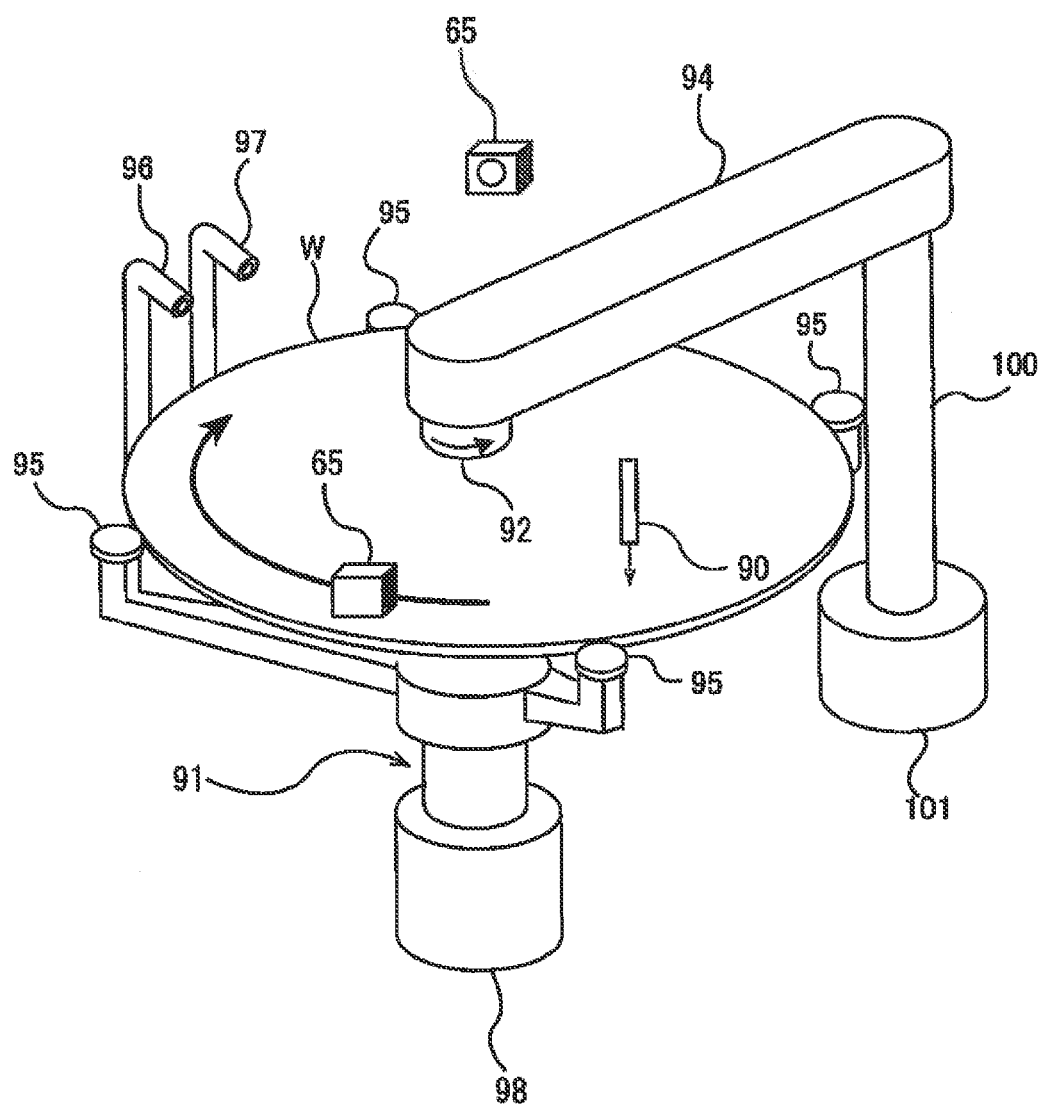
FIG. 10 is a schematic perspective view showing a substrate cleaning apparatus of pen-shaped sponge type.

The substrate processing method according to the embodiment is applicable to other type of substrate cleaning apparatus. FIG. 10 is a schematic perspective view showing a substrate cleaning apparatus. The substrate cleaning apparatus of a pen-shaped sponge type shown in FIG. 10 may be used as the cleaning units 52, 54 shown in FIG. 3.

As shown in FIG. 10, this type of substrate cleaning apparatus includes a substrate holder 91 for holding and rotating a wafer W, a pen-shaped sponge 92, an arm 94 that holds the pea-shaped sponge 92, a pure water supply nozzle 96 for supplying pure water onto an upper surface of the wafer W, and a cleaning liquid supply nozzle 97 for supplying a cleaning liquid (chemical liquid) onto the upper surface of the wafer W. The pen-shaped sponge 92 is coupled to a rotating device (not shown) disposed in the arm 94, so that the pen-shaped sponge 92 is rotated about its central axis extending in a vertical direction.

The substrate holder 91 includes a plurality of (four in FIG. 10) chucks 95 each for holding a peripheral portion of the wafer W. The wafer W is held horizontally by these chucks 95. The chucks 95 are coupled to a motor 98, and thus the wafer W, held by the chucks 95, is rotated about an axis thereof by the motor 98.

The arm 94 is disposed above the wafer W. The pen-shaped sponge 92 is coupled to one end of the arm 94, and a pivot shaft 100 is coupled to the other end of the arm 94. The pivot shaft 100 is coupled to a motor 101 which serves as an arm rotating device configured to cause the arm 94 to pivot. The arm rotating device may include reduction gears, in addition to the motor 101. The motor 101 rotates the pivot shaft 100 through a predetermined angle to thereby cause the arm 94 to pivot in a horizontal plane that is parallel to the wafer W. With this configuration, as the arm 94 pivots, the pen shaped sponge 92, held by the arm 94, is moved outwardly in a radial direction of the wafer W.

Figure 11:
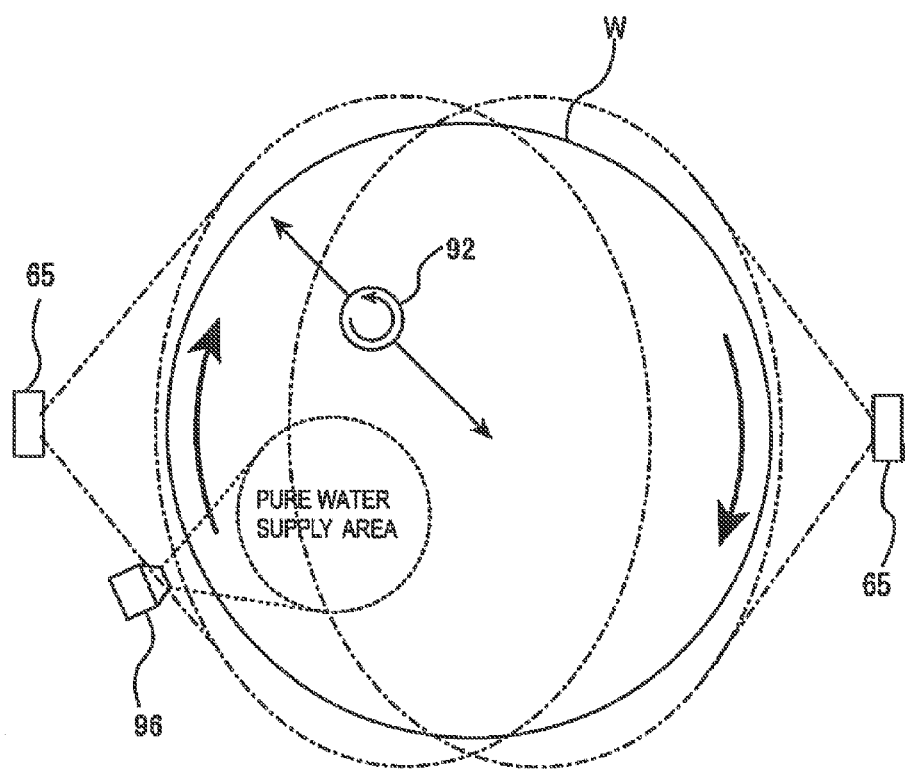
FIG. 11 is a plan view of the substrate cleaning apparatus of pen-shaped sponge type.

FIG. 11 is a plan view of the substrate cleaning apparatus shown in FIG. 10. As shown in FIG. 11, two soft X-ray irradiators 65, 65 are disposed adjacent to the wafer W held by the substrate holder 91. The soft X-ray irradiators 65, 65 are arranged symmetrically with respect to the center of the wafer W, and face toward the upper surface of the wafer W. In order not to allow the pen-shaped sponge 92 to block the soft X-rays, the two soft X-ray irradiators 65, 65 are arranged at both sides of a movement path of the pen-shaped sponge 92. One of the two soft X-ray irradiators 65, 65 is disposed at a downstream side of the pure water supply nozzle 96 with respect to a rotational direction (indicated by arrow) of the wafer W. With this arrangement, the soft X-ray irradiator 65 irradiates the upper surface of the wafer W with the soft X-rays emitted from the downstream side of an area on the wafer W where the pure water is supplied.

Cleaning of the wafer W is performed as follows. First, the wafer W is rotated about an axis thereof. Then, the cleaning liquid is supplied onto the upper surface of the wafer W from the cleaning liquid supply nozzle 97. In this state, the pen-shaped sponge 92 is brought into sliding contact with the upper surface of the wafer W while the pen-shaped sponge 92 is rotating about its own axis extending vertically. Further, the pen-shaped sponge 92 oscillates in the radial direction of the wafer W. The pen-shaped sponge 92 is placed in sliding contact with the upper surface of the wafer W in the presence of the cleaning liquid to thereby scrub the wafer W.

After scrubbing of the wafer W, the irradiation of the wafer W with the soft X-rays is started. Subsequently, in order to rinse off the cleaning liquid from the wafer W, the pure water is supplied from the pure water supply nozzle 96 onto the upper surface of the rotating wafer W, and thus the wafer W is rinsed with the pure water. Next, the supply of the pure water onto the wafer W is stopped, and then the irradiation of the wafer W with the soft X-rays is stopped. The rinsing of the wafer W may be performed while keeping the pen-shaped sponge 92 in sliding contact with the wafer W, or may be performed while keeping the pen-shaped sponge 92 away from the wafer W.

In the substrate cleaning method using the substrate cleaning apparatus shown in FIGS. 10 and 11, the wafer W may be irradiated with the soft X-rays both during scrubbing and rinsing of the wafer W, as with the flowchart shown in FIG. 9.

The above described embodiments of the substrate cleaning method include a process of scrubbing the wafer W with a scrubbing member (e.g., the roll sponges, or the pen-shaped sponge) while supplying the cleaning liquid onto the wafer W. Another embodiment may include a process of simply supplying the cleaning liquid onto the wafer W so as to clean the wafer W.

The above-discussed embodiments are directed to examples in which the substrate processing method is applied to the substrate cleaning method. However, it is noted that the method of the present invention is applicable to a substrate drying method. For example, the present invention is applicable to a substrate drying method including: rotating a substrate at a low speed; irradiating the surface of the substrate with soft X-rays; then supplying pure water (or ultrapure water) onto a surface of the rotating substrate; stopping the irradiation of the substrate with the soft X-rays after stopping the supply of the pure water; and then spin-drying the substrate by rotating the substrate at a high speed.

The electrostatic charge of the substrate is triggered by the supply of the pure water, and progresses with time. The state of the electrostatic charge of the substrate can vary depending on substrate processing conditions. For example, when the substrate is rotated at a high speed, the surface potential increases sharply. However, under some substrate processing conditions, the substrate may be less charged. In such a case, the irradiation of the substrate with the soft X-rays may be started after the supply of the pure water onto the substrate is started.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:

1. A substrate processing method comprising:
pressing a substrate against a polishing surface while supplying slurry onto the polishing surface to polish the substrate until a structure including at least a dielectric film is formed on the polished surface of the substrate;

rotating the substrate having the polished surface about a central axis thereof;

starting irradiation of the polished surface of the substrate with soft X-rays;

simultaneously with or after starting the irradiation of the polished surface of the substrate with the soft X-rays, starting supply of pure water onto the polished surface of the substrate, wherein said irradiation with the soft X-rays and said supplying of the pure water onto the polished surface suppresses electrostatic charge on the dielectric film;

stopping the supply of the pure water onto the polished surface of the substrate; and then stopping the irradiation of the polished surface of the substrate with the soft X-rays.

2. The substrate processing method according to claim 1, wherein the polished surface of the substrate is irradiated with the soft X-rays from a downstream side of an area, to which the pure water is supplied, with respect to a rotational direction of the substrate.

3. The substrate processing method according to claim 1, wherein stopping the irradiation comprises stopping the irradiation of the polished surface of the substrate with the soft X-rays after a liquid film sensor detects that a film of the pure water does not exist on the polished surface of the substrate.

4. The substrate processing method according to claim 1, wherein stopping the irradiation comprises stopping the irradiation of the polished surface of the substrate with the soft X-rays when a predetermined time has elapsed from a point of time when stopping the supply of the pure water onto the polished surface of the substrate.

5. The substrate processing method according to claim 1, wherein the pure water comprises ultrapure water having a specific resistance value of not less than 15M Ω·cm.

6. The substrate processing method according to claim 1, further comprising:

before starting the supply of the pure water onto the polished surface of the substrate, supplying a cleaning liquid onto the polished surface of the substrate to clean the substrate.

7. The substrate processing method according to claim 2, wherein the polished surface of the substrate is irradiated with the soft X-rays from at least two sources of soft X-rays.

8. A substrate processing method, comprising:

pressing a substrate against a polishing surface while supplying slurry onto the polishing surface to polish the substrate until a structure including at least a dielectric film is formed on the polished surface of the substrate;

rotating the substrate having the polished surface about a central axis thereof;

supplying pure water onto the polished surface of the substrate while irradiating the polished surface of the substrate with soft X-rays, wherein said supplying of the pure water and irradiating the polished surface suppresses electrostatic charge on the dielectric film;

stopping the supplying of the pure water onto the polished surface of the substrate; and stopping the irradiating of the polished surface of the substrate with the soft X-rays.

9. The substrate processing method according to claim 8, wherein the polished surface of the substrate is irradiated with the soft X-rays from a downstream side of an area, to which the pure water is supplied, with respect to a rotational direction of the substrate.

10. The substrate processing method according to claim 9, wherein the polished surface of the substrate is irradiated with the soft X-rays from at least two sources of soft X-rays.

* * * * *